(12) United States Patent
Zhang et al.

(10) Patent No.: US 9,773,990 B1
(45) Date of Patent: Sep. 26, 2017

(54) SEMICONDUCTOR DEVICE

(71) Applicants: Tsinghua University, Beijing (CN); HON HAI PRECISION INDUSTRY CO., LTD., New Taipei (TW)

(72) Inventors: Jin Zhang, Beijing (CN); Yang Wei, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/488,414

(22) Filed: Apr. 14, 2017

(30) Foreign Application Priority Data

Jul. 1, 2016 (CN) .......................... 2016 1 0502910

(51) Int. Cl.
*H01L 51/00* (2006.01)
*H01L 51/44* (2006.01)
*H01L 29/41* (2006.01)
*H01L 27/28* (2006.01)
*H01L 51/42* (2006.01)
*H01L 51/05* (2006.01)

(52) U.S. Cl.
CPC .......... *H01L 51/444* (2013.01); *H01L 27/283* (2013.01); *H01L 29/413* (2013.01); *H01L 51/0048* (2013.01); *H01L 51/0583* (2013.01); *H01L 51/0587* (2013.01); *H01L 51/4266* (2013.01)

(58) Field of Classification Search
CPC . H01L 51/57; H01L 51/0545; H01L 27/2481; H01L 51/0048; H01L 27/283; H01L 51/0595; H01L 51/0583; H01L 51/0587; H01L 51/0562; H01L 51/0566; H01L 2924/13061; H01L 2924/10325; G11C 2213/16; G11C 2213/81
See application file for complete search history.

(56) References Cited

U.S. PATENT DOCUMENTS

| | | | | |
|---|---|---|---|---|
| 8,946,683 | B2* | 2/2015 | Rogers ................... | B82Y 10/00 257/40 |
| 2005/0112051 | A1* | 5/2005 | Liu ......................... | B01J 23/88 423/447.1 |
| 2015/0034907 | A1* | 2/2015 | Hersam ............... | H01L 29/8611 257/26 |
| 2017/0062213 | A1* | 3/2017 | Patolsky ........... | H01L 21/02606 |

* cited by examiner

Primary Examiner — Thanh T Nguyen
(74) Attorney, Agent, or Firm — Steven Reiss

(57) ABSTRACT

The present disclosure relates to a semiconductor device comprising a first electrode, a second electrode, a third electrode, a fourth electrode, an insulating layer, and a nano-heterostructure. The nano-heterostructure comprises a first surface and a second surface. The first metallic carbon nanotube is located on the first surface and extends in a first direction. The semiconducting carbon nanotube is located on the first surface and extends in the first direction. The semiconducting carbon nanotube is parallel and spaced away from the first metallic carbon nanotube. The second metallic carbon nanotube is located on the second surface and extends in a second direction. An angle forms between the first direction and the second direction.

18 Claims, 5 Drawing Sheets providing a support and forming a first carbon nanotube layer on the support, the first carbon nanotube layer comprises a plurality of first carbon nanotubes forming the semiconductor layer 106 on the first carbon nanotube layer covering a second carbon nanotube layer on the semiconductor layer 106, and the second carbon nanotube layer comprises a plurality of second carbon nanotubes finding and labeling the first metallic carbon nanotube 102 and the semiconducting carbon nanotube 104 from the first carbon nanotube layer, wherein the first metallic carbon nanotube 102 is parallel to and spaced from the semiconducting carbon nanotube 104; finding and labeling the second metallic carbon nanotube 108 from the second carbon nanotube layer, wherein an extending direction of the second metallic carbon nanotube 108 is crossed with an extending direction of the first metallic carbon nanotube 102 and an extending direction of the semiconducting carbon nanotube 104; and removing the plurality of first carbon nanotubes and the plurality of second carbon nanotubes except the first metallic carbon nanotube 102, the semiconducting carbon nanotube 104 and the second metallic carbon nanotube 108 to form a multilayer structure annealing the multilayer structure obtained by above steps

FIG. 2 providing the support and forming the first carbon nanotube layer on the support, the first carbon nanotube layer comprises a plurality of first carbon nanotubes forming the semiconductor layer 106 on the first carbon nanotube layer covering the second carbon nanotube layer on the semiconductor layer 106, and the second carbon nanotube layer comprises a plurality of second carbon nanotubes finding and labeling the first metallic carbon nanotube 102 and the semiconducting carbon nanotube 104 from the first carbon nanotube layer, wherein the first metallic carbon nanotube 102 is parallel to and spaced from the semiconducting carbon nanotube 104; finding and labeling the second metallic carbon nanotube 108 from the second carbon nanotube layer, wherein the extending direction of the second metallic carbon nanotube 108 is crossed with the extending direction of the first metallic carbon nanotube 102 and the extending direction of the semiconducting carbon nanotube 104; and removing the plurality of first carbon nanotubes and the plurality of second carbon nanotubes except the first metallic carbon nanotube 102, the semiconducting carbon nanotube 104 and the second metallic carbon nanotube 108 forming the third electrode 103 at one end of the first metal carbon nanotube 102, forming the fourth electrode 204 at one end of the semiconducting carbon nanotube 104, and forming the second electrode 202 at one end of the second metal type carbon nanotube 108 annealing a structure obtained by above steps

SEMICONDUCTOR DEVICE

CROSS-REFERENCE TO RELATED APPLICATIONS

This application claims all benefits accruing under 35 U.S.C. §119 from China Patent Application No. 201610502910.9, filed on Jul. 1, 2016, in the China Intellectual Property Office, the contents of which are hereby incorporated by reference.

FIELD

The present disclosure relates to a semiconductor device.

BACKGROUND

Heterojunction is an interface region formed by a contact of two different semiconductor materials. According to the conductivity types of different semiconductor materials, the heterojunction can be divided into homogeneous heterojunction (P-p junction or N-n junction) and heterotypic heterojunction (P-n or p-N). A heterostructure can be formed by multilayer heterojunctions. The heterostructure has excellent photoelectric properties, thus semiconductor devices being made of the heterostructure also have excellent photoelectric properties.

However, the heterogeneous structures of conventional semiconductor devices are usually microstructures, applications of the semiconductor devices are limited.

BRIEF DESCRIPTION OF THE DRAWINGS

Implementations of the present technology will now be described, by way of example only, with reference to the attached figures, wherein:

FIG. 2 is a flow chart of one embodiment of a method for making a nano-heterostructure.

FIG. 5 is a flow chart of one embodiment of a method for making a semiconductor device.

DETAILED DESCRIPTION

Figure 1:
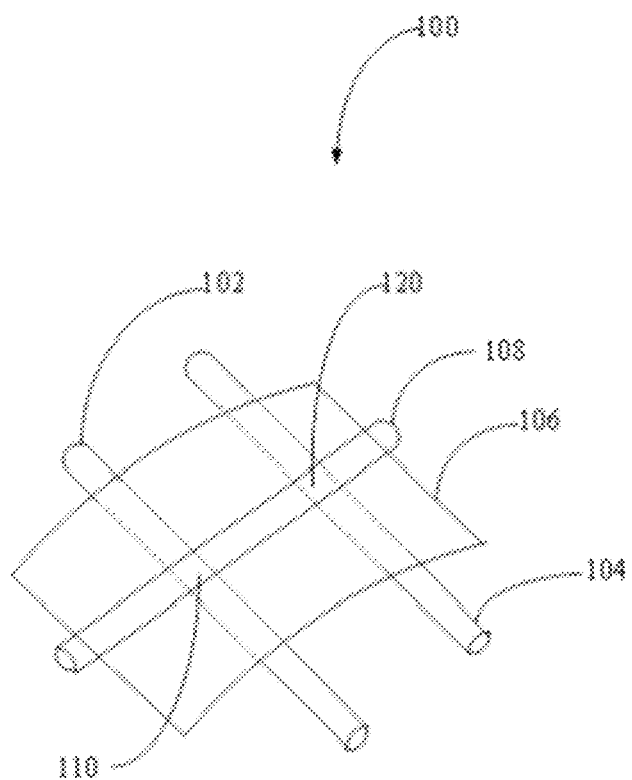
FIG. 1 is a structure schematic view of one embodiment of a nano-heterostructure.

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to illustrate details and features of the present disclosure better.

Several definitions that apply throughout this disclosure will now be presented.

The term "substantially" is defined to be essentially conforming to the particular dimension, shape, or other feature which is described, such that the component need not be exactly or strictly conforming to such a feature. The term "comprise," when utilized, means "include, but not necessarily limited to"; it specifically indicates open-ended inclusion or membership in the so-described combination, group, series, and the like.

Referring to FIG. 1, one embodiment is described in relation to a nano-heterostructure 100. The nano-heterostructure 100 comprises a first metallic carbon nanotube 102, a semiconducting carbon nanotube 104, a semiconductor layer 106 and a second metallic carbon nanotube 108. The semiconductor layer 106 comprises a first surface and a second surface opposite to the first surface. The first metallic carbon nanotube 102 and the semiconducting carbon nanotube 104 are located on and in directly contact with the first surface. The first metallic carbon nanotube 102 and the semiconducting carbon nanotube 104 are parallel and spaced away from each other. The second metallic carbon nanotube 108 is located on and in directly contact with the second surface. The first metallic carbon nanotube 102 and the semiconducting carbon nanotube 104 extend in a first direction. The second metallic carbon nanotube 108 extends in a second direction. An angle can form between the first direction and the second direction. The angle can range from about 0 degrees to about 90 degrees.

The first metallic carbon nanotube 102 can be a single-walled carbon nanotube, double-walled carbon nanotube, or multi-walled carbon nanotube. A diameter of the first metallic carbon nanotube 102 can be ranged from about 0.5 nanometers to about 100 nanometers. In one embodiment, the diameter of the first metallic carbon nanotube 102 ranges from about 0.5 nanometers to about 10 nanometers. In another embodiment, the first metallic carbon nanotube 102 is a single-walled carbon nanotube, and the diameter of the first metallic carbon nanotube 102 is in a range from about 0.5 nanometers to about 2 nanometers. In one embodiment, the first metallic carbon nanotube 102 is a single-walled carbon nanotube, and the diameter of the first metallic carbon nanotube 102 is about 1 nanometer.

The semiconducting carbon nanotube 104 can be a single-walled carbon nanotube, double-walled carbon nanotube, or multi-walled carbon nanotube. A diameter of the semiconducting carbon nanotube 104 can be in a range from about 0.5 nanometers to about 10 nanometers. In one embodiment, the diameter of the semiconducting carbon nanotube 104 is in a range from about 0.5 nanometers to about 5 nanometers. In one embodiment, the semiconducting carbon nanotube 104 is a single-walled carbon nanotube, and the diameter of the semiconducting carbon nanotube 104 is about 1 nanometer.

The semiconductor layer 106 can be a two-dimensional structure. A thickness of the semiconductor layer 106 can be ranged from about 1 nanometer to about 200 nanometers. In one embodiment, the thickness of the semiconductor layer 106 ranges from about 5 nanometers to about 30 nanometers. In another embodiment, the thickness of the semiconductor layer 106 is about 8 nanometers. A material of the semiconductor layer 106 can be inorganic compound semiconductors, elemental semiconductors or organic semiconductors. Such as gallium arsenide, silicon carbide, polysilicon, monocrystalline silicon, naphthalene or molybdenum sulfide. In one embodiment, the material of the semiconductor layer 106 is transition metal sulfide. In one embodiment, the material of the semiconductor layer 106 is Molybdenum sulfide ($MoS_2$), and the thickness of the semiconductor layer 106 is about 8 nanometers.

The second metallic carbon nanotube 108 can be a single-walled carbon nanotube, double-walled carbon nanotube, or multi-walled carbon nanotube. A diameter of the second metallic carbon nanotube 108 can be in a range from about 0.5 nanometers to about 100 nanometers. In one embodiment, the diameter of the second metallic carbon nanotube 108 ranges from about 0.5 nanometers to about 10 nanometers. In one embodiment, the second metallic carbon nanotube 108 is a single-walled carbon nanotube, and the diameter of the second metallic carbon nanotube 108 is ranged from about 0.5 nanometers to about 2 nanometers. In one embodiment, the second metallic carbon nanotube 108 is a single-walled carbon nanotube, and the diameter of the second metallic carbon nanotube 108 is about 1 nanometer. In one embodiment, a material and a size of the second metallic carbon nanotube 108 can be the same as that of the first metallic carbon nanotube 102. In another embodiment, the material and the size of the second metallic carbon nanotube 108 are different from that of the first metallic carbon nanotube 102.

The first metallic carbon nanotube 102 and the semiconducting carbon nanotube 104 are parallel and spaced away from each other. In one embodiment, a spacing of the first metallic carbon nanotube 102 and the semiconducting carbon nanotube 104 is ranged from about 10 nanometers to about 10 microns.

In one embodiment, the angle formed between the first direction and the second direction ranges from about 60 degrees to about 90 degrees. In one embodiment, the angle formed between the first direction and the second direction is about 90 degrees, that is, an extension direction of the first metallic carbon nanotube 102 and an extension direction of the semiconducting carbon nanotube 104 are both substantially perpendicular to an extension direction of the second metallic carbon nanotube 108.

The second metallic carbon nanotube 108 is crossed with the first metallic carbon nanotube 102. A first three layered stereoscopic structure 110 can be formed at an intersection of the first metallic carbon nanotube 102, the second metallic carbon nanotube 108 and the semiconductor layer 106. A cross-sectional area of the first three layered stereoscopic structure 110 is determined by the diameter of the first metallic carbon nanotubes 102 and the second metallic carbon nanotubes 108. Since the first metallic carbon nanotube 102 and the second metallic carbon nanotube 108 are both nanomaterials, the cross-sectional area of the first three layered stereoscopic structure 110 is nanoscale. In one embodiment, the cross-sectional area of the first three layered stereoscopic structure 110 ranges from about 0.25 $nm^2$ to about 1000 $nm^2$. In another embodiment, the cross-sectional area of the first three layered stereoscopic structure 110 ranges from about 0.25 $nm^2$ to about 100 $nm^2$.

The semiconducting carbon nanotube 104 is crossed with the second metallic carbon nanotube 108. A second three layered stereoscopic structure 120 can be formed at an intersection of the semiconducting carbon nanotube 104, the semiconductor layer 106 and the second metallic carbon nanotube 108. A cross-sectional area of the second three layered stereoscopic structure 120 is determined by the diameter of the semiconducting carbon nanotube 104 and the second metallic carbon nanotubes 108. Since the semiconducting carbon nanotube 104 and the second metallic carbon nanotubes 108 are both nanomaterials, the cross-sectional area of the second three layered stereoscopic structure 120 is nanoscale. In one embodiment, the cross-sectional area of the second three layered stereoscopic structure 120 ranges from about 0.25 $nm^2$ to about 1000 $nm^2$. In another embodiment, the cross-sectional area of the second three layered stereoscopic structure 120 ranges from about 0.25 $nm^2$ to about 100 $nm^2$.

The diameter of the first metallic carbon nanotube 102, the diameter of the semiconducting carbon nanotube 104 and the diameter of the second metallic carbon nanotube 108 are all nanoscale. An n-type nano-heterojunction can be formed, without nano-lithography, at the intersection of the first metallic carbon nanotube 102 the semiconductor layer 106, and the second metallic carbon nanotube 108. A nano-heterojunction p-n junction can be formed, without nano-lithography, at the intersection of the semiconducting carbon nanotube 104, the semiconductor layer 106, and the second metallic carbon nanotube 108. When a current gets through the n-type nano-heterojunction, the semiconducting carbon nanotube 104 and the nano-heterojunction P-n junction are in a cut-off state. When a current gets through the semiconducting carbon nanotubes and the nano-heterojunction P-n junction, the n-type nano-heterojunction is in the cut-off state. Since the first metallic carbon nanotube 102 and the second metallic carbon nanotube 108 are all nanoscale, the nano-heterostructure 100 has lower energy consumption and higher integration.

Referring to FIG. 2, one embodiment is described in relation to a method for making the nano-heterostructure 100. The method comprises the following steps:

step (S1), providing a support and forming a first carbon nanotube layer on the support, the first carbon nanotube layer comprises a plurality of first carbon nanotubes;

step (S2), forming the semiconductor layer 106 on the first carbon nanotube layer;

step (S3), covering a second carbon nanotube layer on the semiconductor layer 106, and the second carbon nanotube layer comprises a plurality of second carbon nanotubes;

step (S4), finding and labeling the first metallic carbon nanotube 102 and the semiconducting carbon nanotube 104 from the first carbon nanotube layer, wherein the first metallic carbon nanotube 102 is parallel to and spaced away from the semiconducting carbon nanotube 104; finding and labeling the second metallic carbon nanotube 108 from the second carbon nanotube layer, wherein an extending direction of the second metallic carbon nanotube 108 is crossed with an extending direction of the first metallic carbon nanotube 102 and an extending direction of the semiconducting carbon nanotube 104; and removing the plurality of first carbon nanotubes and the plurality of second carbon nanotubes except for the first metallic carbon nanotube 102, the semiconducting carbon nanotube 104 and the second metallic carbon nanotube 108 to form a multilayer structure; and step (S5), annealing the multilayer structure obtained by above steps.

In step (S1), the support is used to support the first carbon nanotube layer. A material of the support is not limited. In one embodiment, the material of the support is insulation material. In one embodiment, the support is a double-layered structure comprising a lower layer and an upper layer. The lower layer is silicon material, and the upper layer is silicon oxide with a thickness of 300 nanometers. The plurality of first carbon nanotubes can be crossed or parallel to each other. In one embodiment, the plurality of first carbon nanotubes is parallel to each other.

A method for forming the first carbon nanotube layer on the support can be a transfer method comprising the following steps:

step (S11), growing the first carbon nanotube layer on a substrate;

step (S12), coating a transition layer on a surface of the first carbon nanotube layer;

step (S13), separating the transition layer and the first carbon nanotube layer from the substrate; and step (S14), putting the transition layer adhered with the first carbon nanotube layer on the support and removing the transition layer to make the first carbon nanotube layer formed on the support.

In step (S11), the substrate can be a silicon substrate.

In step (S12), a material of the transition layer can be polymethyl methacrylate (PMMA), and a thickness of the transition layer can be ranged from about 0.1 microns to about 1 micron.

In one embodiment, in step (S13), a method for separating the transition layer and the first carbon nanotube layer from the substrate comprises the steps of: transferring the first carbon nanotube layer coated with the transition layer and the substrate into an alkaline solution, and heating the alkaline solution to a temperature ranged from about 70° C. to about 100° C. The first carbon nanotube layer is transferred to the transition layer. The alkaline solution can be sodium hydroxide solution or potassium hydroxide solution. In one embodiment, transferring the first carbon nanotube layer coated with the transition layer and the substrate into potassium hydroxide solution, heating the potassium hydroxide solution to about 90° C. for about 20 minutes.

In step (S14), in one embodiment, the PMMA was removed by acetone dissolution.

In step S2, a method for forming the semiconductor layer 106 on the first carbon nanotube layer comprises the sub-steps of: providing a semiconductor crystal, tearing the semiconductor crystal several times by a tape until a two-dimensional semiconductor layer is formed on the tape, then disposing the two-dimensional semiconductor layer on the surface of the first carbon nanotube layer, and removing the tape. In one embodiment, a molybdenum sulfide single crystal is torn several times by the tape until a molybdenum sulfide layer with nano-thickness is formed on the tape; the tape coated with the molybdenum sulfide layer is covered on the surface of the first carbon nanotube layer; the tape is removed, and at least part of the molybdenum sulfide layer remains on the surface of the first carbon nanotube layer.

In step (S3), the plurality of second carbon nanotubes can be arranged substantially along a same direction. In one embodiment, the plurality of second carbon nanotubes are parallel to each other. An aligned direction of the plurality of first carbon nanotubes is substantially perpendicular to an aligned direction of the plurality of second carbon nanotubes. A method for covering the second carbon nanotube layer on the semiconductor layer 106 can be a transfer method. The transfer method of the second carbon nanotube layer is the same as that of the first carbon nanotube.

Step (S4) comprises the sub-steps of:

step (S41): finding the first metallic carbon nanotube 102 and the semiconducting carbon nanotube 104 from the first carbon nanotube layer via a scanning electron microscopy (SEM), and labeling the coordinate positions of the first metallic carbon nanotube 102 and the semiconducting carbon nanotube 104; and finding the second metallic carbon nanotube 108 from the second carbon nanotube layer via the scanning electron microscopy (SEM), and labeling a coordinate position of the second metallic carbon nanotube 108;

step (S42): protecting the first metallic carbon nanotube 102, the semiconducting carbon nanotubes 104, and the second metallic carbon nanotube 108 by electron beam exposure, exposing the plurality of first carbon nanotubes and the plurality of second carbon nanotubes except for the first metallic carbon nanotube 102, the semiconducting carbon nanotube 104 and the second metallic carbon nanotube 108, and etching away the plurality of first carbon nanotubes and the plurality of second carbon nanotubes except for the first metallic carbon nanotube, the semiconducting carbon nanotube and the second metallic carbon nanotube by plasma etching.

In step (41), building an XY rectangular coordinate system along with a length direction and a width direction of the support; then finding the first metallic carbon nanotube 102, the semiconducting carbon nanotube 104, and the second metallic carbon nanotube 108, and reading out the coordinate values of the first metallic carbon nanotube 102 and the second metallic carbon nanotube 108.

In step (S5), the annealing the multilayer structure obtained by above steps is carried out in a vacuum atmosphere. An annealing temperature can be ranged from about 300° C. to about 400° C. After annealing, impurities on a surface of the nano-heterostructure 100 can be removed, and a contact between the first carbon nanotube layer, the semiconductor layer 106 and the second carbon nanotube layer can be better.

Figure 3:
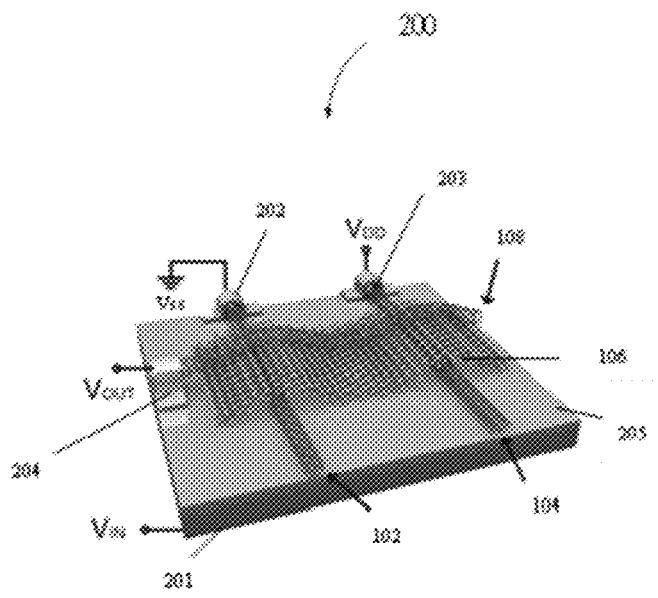
FIG. 3 is structure schematic view of one embodiment of a semiconductor device.

Referring to FIG. 3, one embodiment is described in relation to a semiconductor device 200. The semiconductor device 200 comprises a nano-heterostructure, a first electrode 201, a second electrode 202, a third electrode 203, and a fourth electrode 204. The first electrode 201 is electrically insulated from the second electrode 202, the third electrode 203, the fourth electrode 204, and the nano-heterostructure via an insulating layer 205. The second electrode 202, the third electrode 203, the fourth electrode 204 are electrically connected to the nano-heterostructure. Characteristics of the nano-heterostructure are the same as the nano-hetero structure 100 discussed above.

The second electrode 202, the third electrode 203, the fourth electrode 204 are all made of metal, Indium Tin Oxides (ITO), Antimony Tin Oxide (ATO), conductive silver paste, carbon nanotubes or any other suitable conductive materials. The metal can be aluminum, copper, tungsten, molybdenum, gold, titanium, palladium or any combination of alloys. In one embodiment, each of the second electrode 202, the third electrode 203, and the fourth electrode 204 is a conductive film, a thickness of the conductive film is ranged from about 0.01 microns to about 10 microns. In one embodiment, each of the second electrode 202, the third electrode 203, and the fourth electrode 204 is a metal composite structure formed by compounding metal Au on a surface of metal Ti. A thickness of the metal Ti is ranged from about 5 nanometers. A thickness of the metal Au is about 50 nanometers. In one embodiment, the second electrode 202 is located at one end of the first metallic carbon nanotube 102 and electrically connected to the first metallic carbon nanotube 102; the fourth electrode 204 is located at one end of the second metallic carbon nanotube 108 and electrically connected to the second metallic carbon nanotube 108; and the third electrode 203 is located at one end of the semiconducting carbon nanotube 104 and electrically connected to the semiconducting carbon nanotube 104.

The first electrode 201 can be made of metal, Indium Tin Oxides (ITO), Antimony Tin Oxide (ATO), conductive silver paste, carbon nanotubes or any other suitable conductive materials. The metal can be aluminum, copper, tungsten, molybdenum, gold, titanium, palladium or any combination of alloys. In one embodiment, the first electrode 201 is a layer structure, the insulating layer 205 is located on a surface of the first electrode 201, the second electrode 202, the third electrode 203, the fourth electrode 204, and the nano-heterostructure is located on the insulating layer 205 and supported by the first electrode 201 and the insulating layer 205.

The insulating layer 205 can be made of hard materials or flexible materials. The hard materials can be silicon nitride or silicon oxide. The flexible materials can be Benzocyclobutene (BCB), polyester or acrylic resin. A thickness of the insulating layer 205 ranges from about 2 nanometers to about 100 microns.

Figure 4:
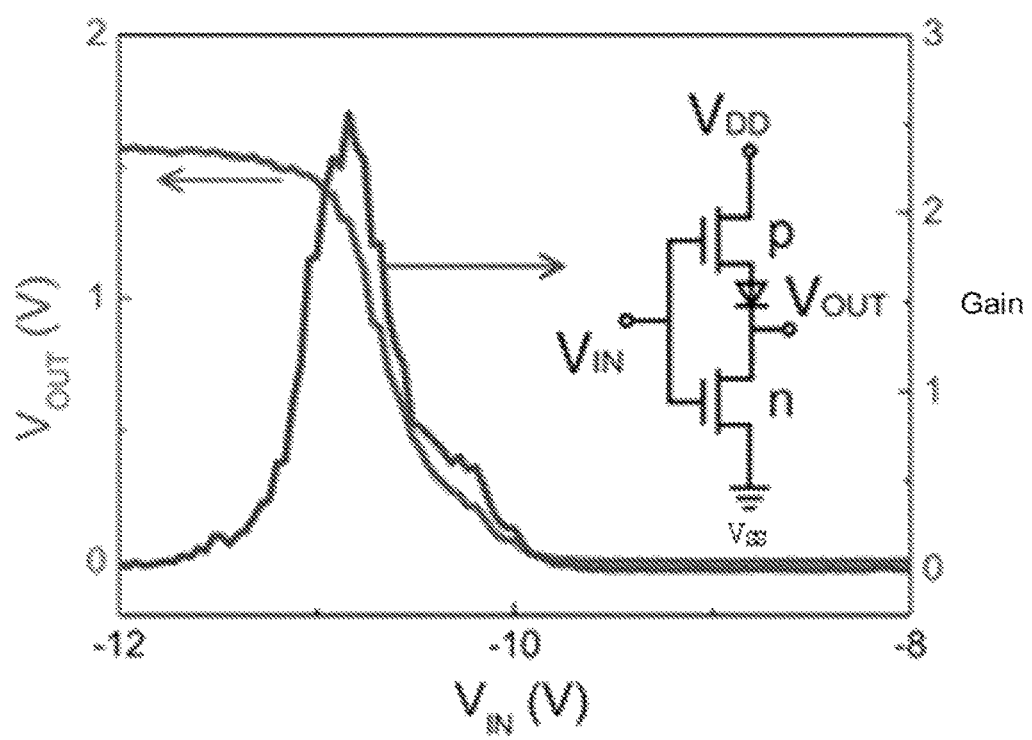
FIG. 4 is a circuit diagram of the semiconductor device in FIG. 3.

An NMOS transistor can be formed by the first metallic carbon nanotube 102, the semiconductor layer 106, the second metallic carbon nanotube 108, the second electrode 202, the fourth electrode 204, the first electrode 201, and the insulating layer 205. A PMOS transistor can be formed by the semiconducting carbon nanotube 104, the semiconductor layer 106, the second metallic carbon nanotube 108, the third electrode 203, the fourth electrode 204, the first electrode 201, and the insulating layer 205. FIG. 4 is a circuit diagram of the semiconductor device 200. If a low electrical level is input to the semiconductor device 200, the PMOS transistor is turned on, the NMOS transistor is turned off, and a high electrical level is output. If a high electrical level is input to the semiconductor device 200, the PMOS transistor is turned off, the NMOS transistor is turned on, and a low electrical level is output. An inverter can be formed by the PMOS transistor and the NMOS transistor alternately working so that there is no low impedance DC path between the power supply operating voltage VDD and the common ground terminal voltage VSS. Therefore, a static power consumption of the semiconductor device 200 is minimal.

In one embodiment, the semiconductor device 200 comprises two nanometer perpendicular heterojunctions; and the semiconductor device 200 is a three-dimensional structure while the in-plane dimensions are on the nanometer scale, which is beneficial to device miniaturization and improves device integration.

Referring to FIG. 4, one embodiment is described in relation to a method for making the semiconductor device 200. The method comprises the following steps:

Step M1: providing a support and forming a first carbon nanotube layer on the support, the first carbon nanotube layer comprises a plurality of first carbon nanotubes;

Step M2: forming the semiconductor layer 106 on the first carbon nanotube layer;

Step M3: covering a second carbon nanotube layer on the semiconductor layer 106, and the second carbon nanotube layer comprises a plurality of second carbon nanotubes;

Step M4: finding and labeling the first metallic carbon nanotube 102 and the semiconducting carbon nanotube 104 from the first carbon nanotube layer, wherein the first metallic carbon nanotube 102 is parallel to and spaced away from the semiconducting carbon nanotube 104; finding and labeling the second metallic carbon nanotube 108 from the second carbon nanotube layer, wherein the extending direction of the second metallic carbon nanotube 108 is crossed with the extending direction of the first metallic carbon nanotube 102 and the extending direction of the semiconducting carbon nanotube 104; and removing the plurality of first carbon nanotubes and the plurality of second carbon nanotubes except for the first metallic carbon nanotube 102, the semiconducting carbon nanotube 104 and the second metallic carbon nanotube 108;

Step M5: forming the second electrode 202 at one end of the first metallic carbon nanotube 102, forming the third electrode 203 at one end of the semiconducting carbon nanotube 104, and forming the fourth electrode 204 at one end of the second metal type carbon nanotube 108; and Step M6: annealing a structure obtained by above steps.

In one embodiment, the support is a double-layered structure comprising a lower layer and an upper layer. The lower layer is a conductive layer, and the upper layer is an insulating layer. The first carbon nanotube layer is formed on the insulating layer. The conductive layer of the support can be the first electrode of the semiconductor device 200.

Characteristics of step M1 are the same as step S1 of the second embodiment. Characteristics of step M2 are the same as step S2 of the second embodiment. Characteristics of step M3 are the same as step S3 of the second embodiment. Characteristics of step M4 are the same as step S4 of the second embodiment. Characteristics of step M6 are the same as step S5 of the second embodiment.

In step M5, each of the first electrode 201, the second electrode 202, and the third electrode 203 is made of metal, alloy, ITO, ATO, conductive silver paste, conductive polymers, conductive carbon nanotubes or any other suitable conductive materials. The metal can be aluminum, copper, tungsten, molybdenum, gold, titanium, palladium or any combination of alloys. In one embodiment, each of the first electrode 201, the second electrode 202, and the third electrode 203 is a conductive film, a thickness of the conductive film is ranged from about 0.01 microns to about 10 microns.

If each of the second electrode 202, the third electrode 203, and the fourth electrode 204 is made of metal, alloy, ITO, or ATO, each of the second electrode 202, the third electrode 203, and the fourth electrode 204 can be formed by vapor deposition, sputtering, deposition, masking, or etching. If each of the second electrode 202, the third electrode 203, and the fourth electrode 204 is made of conductive silver paste, conductive polymers, or conductive carbon nanotubes, each of the second electrode 202, the third electrode 203, and the fourth electrode 204 can be formed by printing or direct adhesion.

In one embodiment, each of the second electrode 202, the third electrode 203 and the fourth electrode 204 is a metal composite structure of Au and Ti. Step M5 comprises the sub-steps of:

step (M51): coating a layer of photoresist on a surface of the support;

step (M52): separately depositing a metal layer on a surface of the first metallic carbon nanotube 102, a surface of the semiconducting carbon nanotube 104, and a surface of the second metallic carbon nanotube 108 by electron beam exposure, development, or electron beam deposition;

step (M53): peeling off by organic solvents, such as acetone.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the steps of a method described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A semiconductor device comprising:
a first electrode, a second electrode, a third electrode and a fourth electrode;
a nano-heterostructure electrically connected to the second electrode, the third electrode, and the fourth electrode; and
an insulating layer, the first electrode being electrically insulated from the second electrode, the third electrode, the fourth electrode, and the nano-heterostructure via the insulating layer; wherein the nano-heterostructure comprises:
a semiconductor layer comprising a first surface and a second surface opposite to the first surface;
a first metallic carbon nanotube located on the first surface and extending along a first direction;
a semiconducting carbon nanotube located on the first surface and extending along the first direction, and the semiconducting carbon nanotube being parallel and spaced away from the first metallic carbon nanotube; and
a second metallic carbon nanotube located on the second surface and extending along a second direction, and an angle being formed between the first direction and the second direction.

2. The semiconductor device of claim 1, wherein the angle ranges from about 60 degrees to about 90 degrees.

3. The semiconductor device of claim 2, wherein the angle is about 90 degrees.

4. The semiconductor device of claim 1, wherein a diameter of the first metallic carbon nanotube ranges from about 0.5 nanometers to about 10 nanometers.

5. The semiconductor device of claim 4, wherein the first metallic carbon nanotube is a single-walled carbon nanotube and the diameter of the first metallic carbon nanotube is in a range from about 0.5 nanometers to about 2 nanometers.

6. The semiconductor device of claim 1, wherein a diameter of the semiconducting carbon nanotube is in a range from about 0.5 nanometers to about 10 nanometers.

7. The semiconductor device of claim 6, wherein the semiconducting carbon nanotube is a single-walled carbon nanotube and the diameter of the semiconducting carbon nanotube is about 1 nanometer.

8. The semiconductor device of claim 1, wherein a thickness of the semiconductor layer ranges from about 5 nanometers to about 30 nanometers.

9. The semiconductor device of claim 1, wherein a material of the semiconductor layer is transition metal sulfide.

10. The semiconductor device of claim 9, wherein the material of the semiconductor layer is Molybdenum sulfide.

11. The semiconductor device of claim 1, wherein a diameter of the second metallic carbon nanotube ranges from about 0.5 nanometers to about 10 nanometers.

12. The semiconductor device of claim 11, wherein the second metallic carbon nanotube is a single-walled carbon nanotube and the diameter of the second metallic carbon nanotube is ranged from about 0.5 nanometers to about 2 nanometers.

13. The semiconductor device of claim 1, wherein a spacing of the first metallic carbon nanotube and the semiconducting carbon nanotube is ranged from about 10 nanometers to about 10 microns.

14. The semiconductor device of claim 1, wherein a first three layered stereoscopic structure is formed at an intersection of the first metallic carbon nanotube, and the second metallic carbon nanotube, and the semiconductor layer.

15. The semiconductor device of claim 14, wherein a cross-sectional area of the first three layered stereoscopic structure ranges from about 0.25 $nm^2$ to about 1000 $nm^2$.

16. The semiconductor device of claim 1, wherein a second three layered stereoscopic structure is formed at an intersection of the semiconducting carbon nanotube, the semiconductor layer, and the second metallic carbon nanotube.

17. The semiconductor device of claim 16, wherein a cross-sectional area of the second three layered stereoscopic structure ranges from about 0.25 $nm^2$ to about 1000 $nm^2$.

18. A semiconductor device comprising:
a first electrode, a second electrode, a third electrode and a fourth electrode;
a nano-heterostructure electrically connected to the second electrode, the third electrode, and the fourth electrode; and
an insulating layer, the first electrode being electrically insulated from the second electrode, the third electrode, the fourth electrode, and the nano-heterostructure via the insulating layer; wherein the nano-heterostructure comprises:
a semiconductor layer comprising a first surface and a second surface opposite to the first surface;
a first metallic carbon nanotube located on the first surface and extending along a first direction;
a semiconducting carbon nanotube located on the first surface and extending along the first direction, and the semiconducting carbon nanotube being parallel and spaced away from the first metallic carbon nanotube; and
a second metallic carbon nanotube located on the second surface and extending along a second direction, and an angle being formed between the first direction and the second direction, wherein a first three layered stereoscopic structure is formed at an intersection of the first metallic carbon nanotube, the second metallic carbon nanotube, and the semiconductor layer; and a second three layered stereoscopic structure is formed at an intersection of the semiconducting carbon nanotube, the semiconductor layer, and the second metallic carbon nanotube.

* * * * *